(12) United States Patent
Buchanan et al.

(10) Patent No.: US 10,424,378 B2
(45) Date of Patent: Sep. 24, 2019

(54) MEMRISTIVE CONTROL CIRCUITS WITH CURRENT CONTROL COMPONENTS

(71) Applicant: Hewlett Packard Enterprise Development LP, Houston, TX (US)

(72) Inventors: Brent Buchanan, Fort Collins, CO (US); Le Zheng, Palo Alto, CA (US); John Paul Strachan, San Carlos, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 16/073,922

(22) PCT Filed: Feb. 24, 2016

(86) PCT No.: PCT/US2016/019257
§ 371 (c)(1),
(2) Date: Jul. 30, 2018

(87) PCT Pub. No.: WO2017/146692
PCT Pub. Date: Aug. 31, 2017

(65) Prior Publication Data
US 2019/0043573 A1   Feb. 7, 2019

(51) Int. Cl.
*G11C 13/00* (2006.01)
*G11C 11/16* (2006.01)
(Continued)

(52) U.S. Cl.
CPC ...... *G11C 13/0069* (2013.01); *G11C 11/1653* (2013.01); *G11C 11/1655* (2013.01);
(Continued)

(58) Field of Classification Search
CPC ............ G11C 13/0002; G11C 13/0021; G11C 13/0026; G11C 13/0028; G11C 13/0003; G11C 13/0069; G11C 2013/0071
See application file for complete search history.

(56) References Cited

U.S. PATENT DOCUMENTS 6,606,263 B1    8/2003  Tang
7,251,163 B2 *  7/2007  O ........................ G11C 5/145
                                                      365/185.18
(Continued)

FOREIGN PATENT DOCUMENTS

CN       103310841        9/2003
WO     WO-2015085093      6/2015

OTHER PUBLICATIONS

International Search Report & Written Opinion received in PCT Application No. PCT/US2016/019257, dated Nov. 7, 2016, 10 pages.
(Continued)

*Primary Examiner* — Vanthu T Nguyen
(74) *Attorney, Agent, or Firm* — Hewlett Packard Enterprise Patent Department

(57) ABSTRACT

In one example in accordance with the present disclosure a control circuit is described. The control circuit includes a source following component to receive an input voltage and output a switching voltage. The circuit also includes an input leg of a current mirror coupled to the source following component. The input leg of the current mirror replicates the switching voltage to an output leg of the current mirror of a memristive bit cell. The circuit also includes a number of current control components. At least one of the current control components enforces a constant current through the source following component and other current control com-
(Continued)

ponents maintain the input leg of the current mirror and the output leg of the current mirror at the same current.

15 Claims, 9 Drawing Sheets

(51) Int. Cl.
 *G11C 11/22* (2006.01)
 *G11C 29/50* (2006.01)
(52) U.S. Cl.
 CPC ...... *G11C 11/1657* (2013.01); *G11C 11/1673* (2013.01); *G11C 11/2297* (2013.01); *G11C 13/0002* (2013.01); *G11C 13/003* (2013.01); *G11C 13/004* (2013.01); *G11C 13/0007* (2013.01); *G11C 13/0021* (2013.01); *G11C 13/0023* (2013.01); *G11C 13/0026* (2013.01); *G11C 13/0028* (2013.01); *G11C 13/0038* (2013.01); *G11C 29/50012* (2013.01); *G11C 2013/0045* (2013.01); *G11C 2013/0071* (2013.01); *G11C 2013/0073* (2013.01); *G11C 2213/79* (2013.01)

(56) References Cited

U.S. PATENT DOCUMENTS

| 8,422,269 | B2* | 4/2013 | Sasaki ............... G11C 13/0026 365/148 |
| 8,971,091 | B2 | 3/2015 | Yi et al. |
| 9,355,720 | B2* | 5/2016 | Ahn .................... G11C 13/0061 |
| 9,502,088 | B2* | 11/2016 | Jung .................... G11C 11/1673 |
| 2011/0182104 | A1 | 7/2011 | Kim et al. |
| 2012/0230081 | A1 | 9/2012 | Close et al. |
| 2013/0010521 | A1 | 1/2013 | Carter |
| 2013/0235651 | A1 | 9/2013 | Perner et al. |
| 2013/0322154 | A1 | 12/2013 | Youn et al. |
| 2016/0070294 | A1* | 3/2016 | Chung ..................... H03K 5/24 345/213 |

OTHER PUBLICATIONS

Wang, Z. et al.,"A 2-Transistor/1-Resistor Artificial Synapse Capable of Communication and Stochastic Learning in Neuromorphic Systems".

* cited by examiner

MEMRISTIVE CONTROL CIRCUITS WITH CURRENT CONTROL COMPONENTS

BACKGROUND

Memristive devices, for example memristors, are devices that may be programmed to different states by applying a programming stimulus, for example a voltage pulse or a current pulse. After programming, the state of the memristive device may be read. The state of the memristive device remains stable long enough to regard the device as non-volatile. A number of memristive devices may be included within a crossbar array in which a number of interconnect lines intersect one another to form a grid, the memristive device being located at the intersection of corresponding interconnect lines. These arrays can provide high storage density. Memristor devices can be used in a variety of applications, including non-volatile solid state memory, programmable logic, signal processing, control systems, pattern recognition, and other applications.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
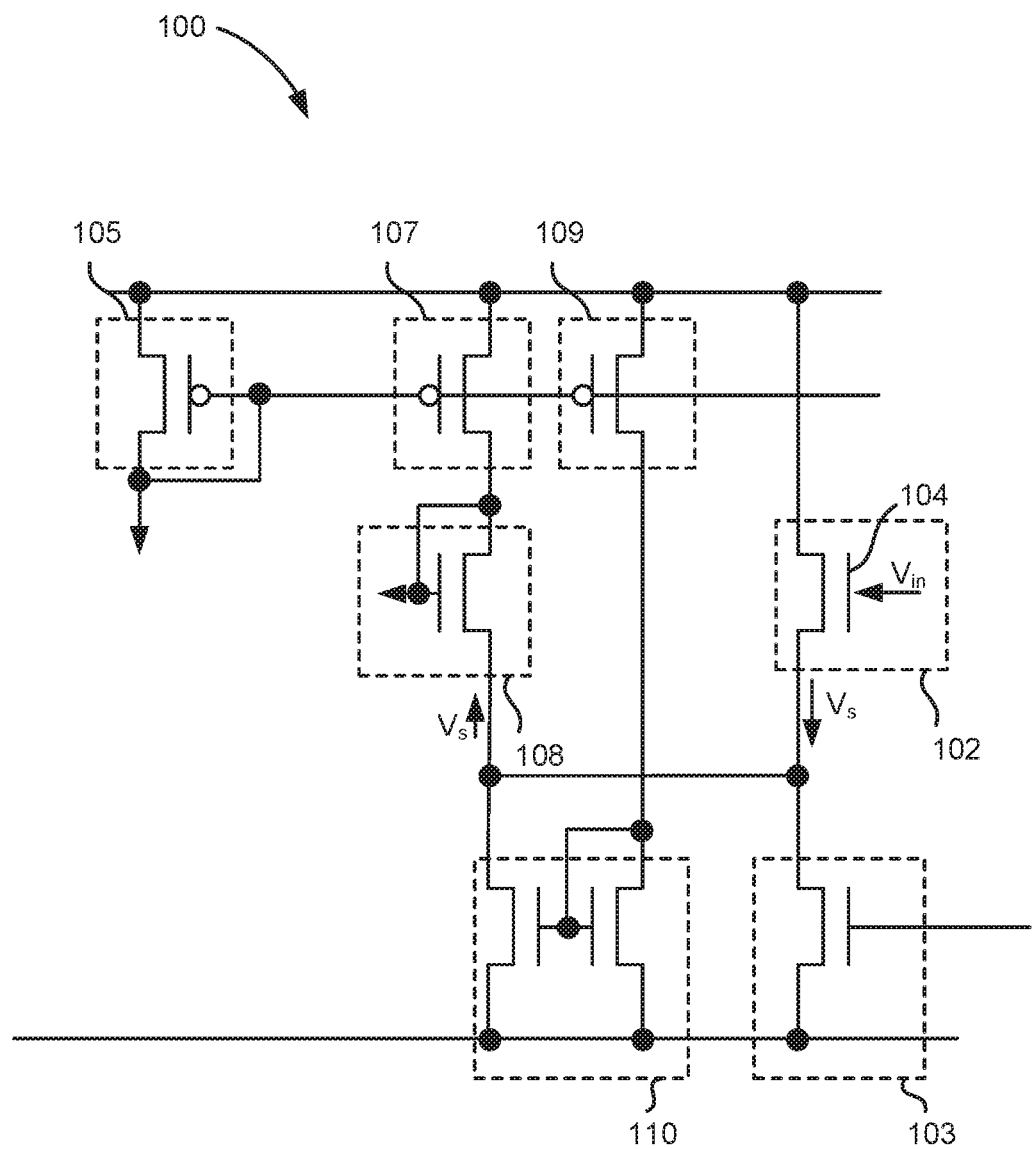
FIG. 1 is a diagram of a control circuit for a memristive device, according to one example of the principles described herein.

Arrays of memristive devices such as memristors may be used in a variety of applications, including non-volatile solid state memory, programmable logic, signal processing, control systems, pattern recognition, and other applications.

Increasingly smaller computing devices have led to an increased focus on developing smaller components, such as memory arrays and integrated circuits that carry out the functions listed above as well as other functions. Crossbar arrays are one example of reduced-size memory arrays. A crossbar array includes a first set of interconnect lines that intersect a second set of interconnect lines, in an approximately orthogonal orientation for example. Throughout the specification, the first set of interconnect lines may be referred to as row lines and the second set of interconnect lines may be referred to as column lines. However, the terms row and column are merely used to simplify the description and the first set of interconnect lines and second set of interconnect lines may be oriented in other fashions than rows or columns.

A bit cell is placed at each intersection of a row line and a column line. A bit cell may include a memory element to store information and a number of selectors to allow or prevent current flow through the corresponding memory element. In this example, a number of memory elements may share a particular row line and another number of memory elements may share a particular column line. In the present application, for simplicity row lines and column lines are used to refer to groupings of memristive devices. However, the row lines and the column lines as used herein may be interchanged and still allow for the implementation of the subject matter of the present application.

The array of the present application can also be used to perform a multiply-accumulate (MAC) operation of, for example, a number of matrix values and a number of input vector values. For example, an input voltage signal along each row of an array is weighted by the resistance of the memristive devices in a column, and accumulated as the current output from each column. Accordingly, a state of a memristive device can be used to either store information such as in a memory array, or can be used to perform operations such as a multiply-accumulate operation which is used in filtering.

In either case, each memory device can represent multiple logic values, for example a 1 and a 0, or an analog level. Memory devices such as memristive devices use resistance levels to indicate a particular logic or analog value. In using a memristive device as an element in an array, a digital operation is emulated by applying an activation stimulus such as voltage pulses of different values or polarities to place the memristive device in a "low resistance state", a "high resistance state", or an intermediate resistance state which resistance states are associated with either a logical value, such as "1" or "0," or an analog value, respectively. Switching a memristive device such as a memristor from an initial high resistance state to a low resistance state is referred to as a "set" operation and switching a memristive element from a low resistance state to a high resistance state is referred to as a "reset" operation.

Each memristive device has a switching voltage which refers to a voltage potential across a memristive device which effectuates a change in the resistance state of the memristive device. For example, a switching voltage of a memristive device may be between 1-2 volts (V). In this example, a voltage potential across the memristive device that is greater than the switching voltage (i.e., the 1-2V) causes the memristive device to change between resistance states.

This voltage potential across the memristive device is applied via different interconnect lines that are coupled to the memristive device. However, as memristive devices share interconnect lines, other memristive devices, i.e., other than the one intended to be switched, also see the same voltage potential and therefore may inadvertently switch. Accordingly, a selector may be placed serially with a memristive device. The selector may have a threshold voltage. An applied voltage less than the threshold voltage does not pass through to the corresponding memristive device and thus the memristive device does not see the voltage potential. While memristive device arrays have the potential for widespread application, some characteristics reduce their usefulness in certain applications.

For example, the switching voltages used to switch a memristive device between states is often applied as a square waveform pulse. However, experimentation has shown that applying a non-square waveform pulse leads to improved behavior. For example, a memristive device is more durable if a shaped waveform is used and the state of the memristive device is better retained if a shaped waveform is used. Still further, read and write margins for the individual memristive devices are improved. However, implementation of circuits to provide arbitrary shaped waveforms to switch a state of a memristive device has been difficult.

Moreover, while memristive devices have numerous applications, the different applications implement different control circuits attached to the array. Accordingly, there may be as many control circuits for memristive devices as there are applications for memristive devices.

Accordingly, the present specification describes a control circuit that, among other things, passes a shaped waveform to a memristive device. Also, the present specification includes components that allow the control circuit to be used in various applications. Still further, the control circuit as described herein allows for the circuit to be used as either a row control circuit or a column control circuit.

More specifically, the present specification describes a control circuit for a memristive device. The control circuit includes a source following component to receive an input voltage and output a switching voltage. An input leg of a first current mirror is coupled to the source following component and replicates the switching voltage to an output leg of the first current mirror. The output leg is in a memristive bit cell. The control circuit further includes a number of current control components. The current control components 1) enforce a constant current through the source following component and 2) maintain the input leg of the first current mirror and the output leg of the first current mirror at the same current.

The present specification also describes a memristive array. The memristive array includes a number of first lines and a number of second lines intersecting the first lines to form a number of junctions. A number of memristive bit cells are coupled between the first lines and the second lines at the junctions. The array includes a number of first line control circuits coupled to the number of first lines and a number of second line control circuits coupled to the number of second lines. Each of the first line control circuits and second line control circuits include an instance of a control circuit. A control circuit includes a source following component to receive an input voltage and output a switching voltage, an input leg of a first current mirror coupled to the source following component to replicate the switching voltage to an output leg of the first current mirror of a memristive bit cell, and a number of current control components. The current control components 1) enforce a constant current through the source following component and 2) maintain the input leg and the output leg at the same current.

The present specification also describes a control circuit for a memristive device. The control circuit includes a source following component to receive an input voltage and output a switching voltage, an input leg of a first current mirror coupled to the source following component to replicate the switching voltage to an output leg of the first current mirror of a memristive bit cell, and a number of current control components. The current control components 1) enforce a constant current through the source following component and 2) maintain the input leg and the output leg at the same current. The control circuit also includes a sensing component to output a signal indicating a state of the memristive device.

Using a control circuit that performs the various functions described herein 1) allows a single control circuit to be used in multiple applications thereby reducing overhead in manufacturing control circuits; 2) allows for a single control circuit design to be used as a first line control circuit or a second line control circuit; and 3) passes a switching pulse that may or may not be a square waveform to the memristive bit cell to at least increase retention, endurance, and read-write margins. However, it is contemplated that the devices disclosed herein may provide useful in addressing other matters and deficiencies in a number of technical areas. Therefore the systems and methods disclosed herein should not be construed as addressing any of the particular matters.

As used in the present specification and in the appended claims, the term "memristive device" or "memristor" may refer to a passive two-terminal circuit element that maintains a functional relationship between the time integral of current, and/or the time integral of voltage.

Further, as used in the present specification and in the appended claims, the term "switching voltage" may refer to a voltage potential across a memristive device which effectuates a change in the state of the memristive device. For example, a switching voltage of a memristive device may be between 1-2 volts (V). In this example, a voltage potential across the memristive device that is greater than the switching voltage (i.e., the 1-2 V) causes the memristive device to change between resistance states. A memristive device may have multiple switching voltages. For example, a first switching voltage may be a voltage which, if surpassed, "sets" the memristive device from a high resistance state to a low resistance state. Similarly, a second switching voltage may a voltage which, if surpassed, "resets" the memristive device from a low resistance state to a high resistance state. While specific reference is made to a voltage pulse, the activation stimulus to change the state of the memristive device may also be provided by a current source.

Further, as used in the present specification and in the appended claims, the term "target" refers to a memristive device that is to be written to or read from. Target first lines, and target second lines are those first lines and second lines that correspond to the target memory device. A target memristive device may refer to a memristive device with a closed selector as opposed to an open selector.

Even further, as used in the present specification and in the appended claims the term "interconnect lines" refers to conducting electrical lines that are used to select a memristive device. The interconnect lines include the first lines i.e., row lines and the second lines i.e., the column lines.

Even further, as used in the present specification and in the appended claims, the term "a number of" or similar language is meant to be understood broadly as any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language indicates that a particular feature, structure, or characteristic described in connection with that example is included as described, but may not be included in other examples.

Turning now to the figures, FIG. 1 is a diagram of a control circuit (100) for a memristive device, according to one example of the principles described herein. A control circuit (100) for a memristive device is an electrical circuit, electronic component, or combinations thereof that is used to control the memristive device. In this example, the control circuit (100) passes signals in the form of currents and voltages to memristive devices and also receives outputs in the form of voltages and currents from the memristive devices. The memristive devices may be used to store memory and may also be used to carry out operations such as filtering, transforming, and many other type of operations.

The control circuit (100) depicted in FIG. 1 may be used to drive multiple memristive devices. For example, as depicted in at least FIGS. 3 and 8, the memristive devices may be arranged in an array with sets of interconnect lines passing signals to and from the memristive devices. In this example, an instance of a control circuit (100) may be coupled to each of the first set (i.e., rows) of interconnect lines and to each of the second set (i.e., columns) of interconnect lines.

The control circuit (100) may be implemented in an electronic device. Examples of electronic devices include servers, desktop computers, laptop computers, personal digital assistants (PDAs), mobile devices, smartphones, gaming systems, and tablets, among other electronic devices. The control circuit (100) may be utilized in any data processing scenario including, stand-alone hardware, mobile applications, through a computing network, or combinations thereof. Further, the control circuit (100) and corresponding memristive array may be used in a computing network, a public cloud network, a private cloud network, a hybrid cloud network, other forms of networks, or combinations thereof.

The control circuit (100) includes a source following component (102) to receive an input voltage, $V_{in}$, and to output a switching voltage, $V_s$. The output switching voltage, $V_s$, is a constant-voltage pulse or a waveform that will be replicated and applied to the memristive device, and the input voltage, $V_{in}$, is the signal that generates $V_s$. $V_{in}$ may be a non-square waveform. More specifically, in some instances such as a set operation, $V_{in}$ may be a shaped waveform such as a pulse waveform that has a decreasing amplitude. In other examples such as a reset operation, $V_{in}$ may be a shaped waveform such as a pulse waveform that has an increasing amplitude. The input waveform may be of multiple and different types of waveforms. For example, during a set operation, one type of waveform such as a waveform with a pulse having decreasing amplitude is generated and during a reset operation a waveform that is a pulse with increasing amplitude is generated. As described above, a square, and static waveform pulse, while able to switch the state of a memristive device, is not ideal in that a shaped, and dynamic waveform, may result in better endurance, retention, and read margins for the memristive device. In other words, applying a shaped waveform to the memristive device allows for improved operation, and more control over the operation, of the memristive device.

As depicted in FIG. 1, the source following component (102) may include a source follower transistor (104). A source follower transistor (104) is a transistor where the voltage on a source of the transistor follows the voltage on the gate of the transistor (to a first order), provided the current through the source follower transistor (104) is held constant. Accordingly, the control circuit (100) includes a first current control component (103) to enforce a constant current through the source following component (102). As will be described below, the first current control component (103) may include a transistor that is an output leg of a corresponding current mirror.

Returning to the source following component (102), the source follower transistor (104) receives an input voltage, $V_{in}$, at the gate of the transistor. As transistors have a threshold voltage that must be reached before conducting, the switching voltage, $V_s$, output from the source of the source follower transistor (104) may be an amount, $V_t$, less than the input voltage.

The control circuit (100) also includes an input leg (108) of a first current mirror to replicate the switching voltage, $V_s$, to an output leg of the first current mirror. The input leg (108) of the first current mirror is a transistor. The output leg of the current mirror is also a transistor that is part of the memristive bit cell described below in FIG. 2. When the input and output transistors of a current mirror have the same current passing through their respective channels, and the same voltage is applied to their respective gates, the voltages on their sources will similarly be the same (to a first order). Accordingly, as the switching voltage, $V_s$, is applied to the source of the input transistor of the input leg (108), this voltage is replicated at the source of the current mirror's output transistor, depicted in FIG. 2 as 216-1, in the output leg of the current mirror.

Further if the channel current through each transistor of the current mirror is the same, and both transistors are at the same gate voltage, the voltage on the sources of the legs of the current mirror will also be the same (to a first order). Accordingly, the control circuit (100) includes at least a second and a third current control component (105, 107) to ensure that the current between the input leg (108) of the current mirror and the output leg of the current mirror have the same channel currents. Specifically, the second control component (105), which may be a p-type field effect transistor, monitors the current passing through the output transistor (which is part of the memristive bit cell) and acts as an input to a current mirror with the third current control component (107), i.e., another p-type field effect transistor, as an output.

Accordingly, any current passing through the memristive bit cell is replicated and passed through the input leg (108) transistor of the first current mirror, thus ensuring both legs of the first current mirror are seeing the same current. As a field-effect transistor (FET) is included in the input leg (108) of a current mirror, a gate-to-drain connection will cause this FET to find the correct gate voltage for the current flowing through its channel. Since the FET on the output leg has its gate attached to the FET gate of the input leg (108), both input and output FETs have the same gate voltage.

In summary, an input voltage, $V_{in}$, is passed to the gate of a source follower transistor (104). As the current is maintained constant through the source follower transistor (104) by way of the first control component (103) transistor, the relationship between $V_{in}$ and $V_s$ is maintained such that greater control over $V_s$ is possible. The switching voltage $V_s$, is then passed to a source of the input leg (108) transistor of the first current mirror, and then to the source of the output leg transistor of the first current mirror as described above. As the currents through the input leg (108) and the output leg of the first current mirror are also the same, the source voltages of the input leg (108) transistor and the output leg transistor are also the same. In other words, as the gate voltages of the input leg and the output leg are the same, i.e., $V_s$, and the channel currents are the same (maintained by the p-type field effect transistors in the second and third current control components (105, 107)), then the output leg of the first current mirror will see the same voltage on its source as the input leg (108) has on its source, which input leg (108) has $V_s$, on its source as indicated in FIG. 1.

In this fashion, the switching voltage $V_s$, applied to a memristive device can readily be generated and controlled. As described above, the control circuit (100) allows for controlled application of a shaped, or non-shaped waveform, to a memristive device to effectuate switching of state of the memristive device. Such shaped waveforms enable enhanced and more robust performance of a memristive device and any component of which the memristive device is a part.

It should be noted that when a memristive device switches, the amount of current passing through it, and thereby the output leg of the current mirror, can change quite substantially. Accordingly, the control circuit (100) also includes at least a fourth current control component (109) to ensure that the current sourced by the FET of the input leg (108) is fully sunk regardless of its magnitude, without affecting the relationship between the source voltages of the first current mirror as described above. This excess current is then sunk by the absorption component (110).

Figure 2:
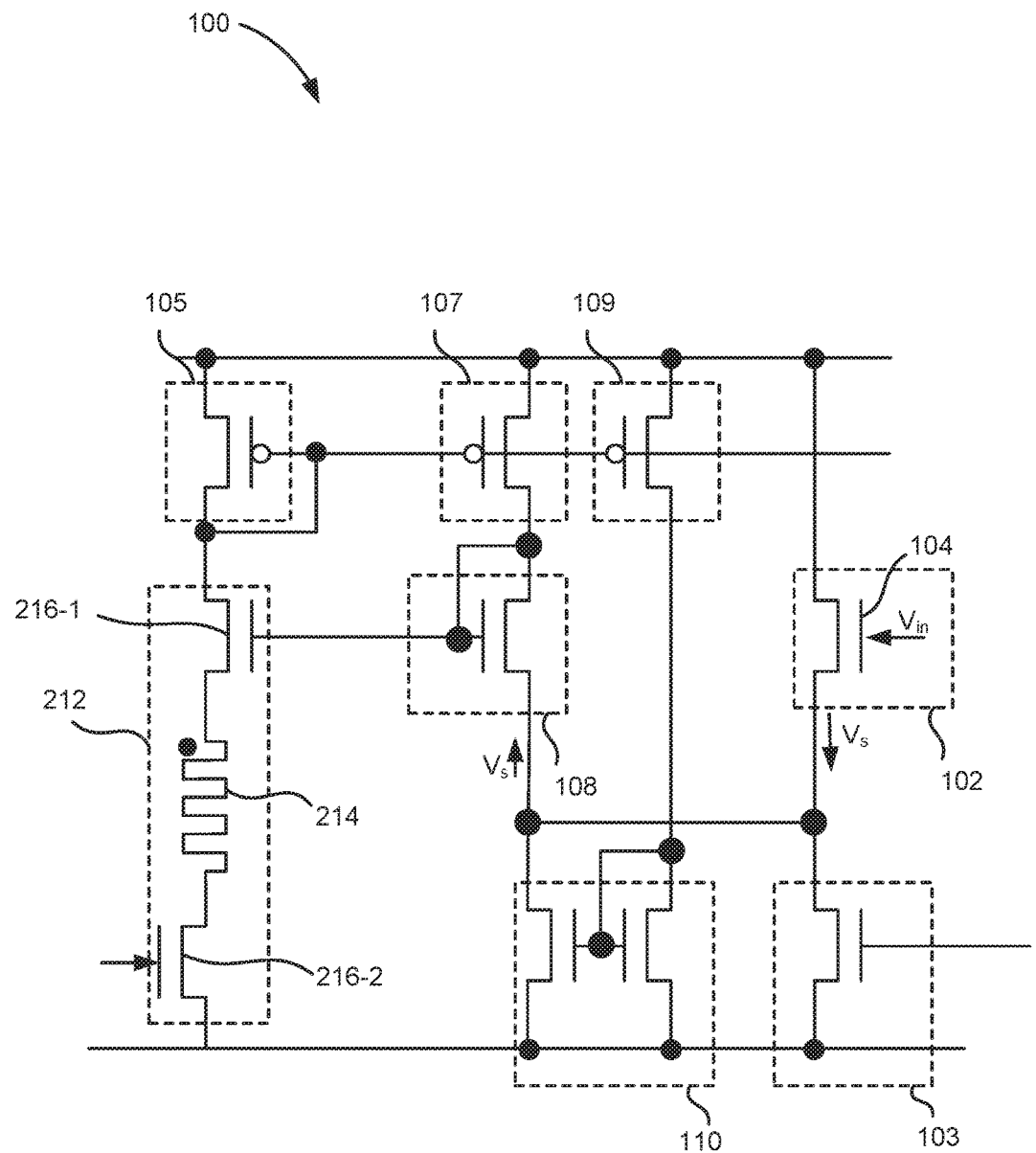
FIG. 2 is a diagram of a memristive bit cell and a control circuit for a memristive device, according to one example of the principles described herein.

FIG. 2 is a diagram of a memristive bit cell (212) and a control circuit (100) for a memristive device (214), according to one example of the principles described herein. Each bit cell (212) includes a memristive device (214) and at least one selecting transistor (216-1, 216-2).

The memristive device (214) can be used to represent a number of bits of data or an analog value. For example, a memristive device (214) in a low resistance state may represent a logic value of "1." The same memristive device (214) in a high resistance state may represent a logic value of "0." Each logic value is associated with a resistance state of the memristive device (214) such that data can be stored in a memristive device (214) by changing the resistance state of the memristive device (214). This may be done by applying a voltage potential across a target memristive device (214) by passing voltages to interconnect lines that correspond to the target memristive device (214).

A memristive device (214) may change resistances by transporting dopants within a switching layer to increase or decrease the resistivity of the memristive device (214). As a sufficient voltage is passed across the memristive device (214) the dopants become active such that they move within a switching layer and thereby change the resistance of the memristive device (214).

A memristive device (214) is non-volatile because the memristive device (214) maintains its resistivity, and indicated logic value even in the absence of a supplied voltage. In this manner, the memristive devices (214) are "memory resistors" in that they "remember" the last resistance that they had. Put another way, if charge flows in one direction through a memristive device (214), the resistance of that component of the circuit will increase. If charge flows in the opposite direction in the memristive device (214), the resistance will decrease. If the flow of charge is stopped by turning off the applied voltage, the memristive device (214) will "remember" the last resistance that it had, and when the flow of charge starts again the resistance of the memristive device (214) will be what it was when it was last active.

Memristive devices (214) in a memristor array may take many forms. One example is a metal-insulator-metal structure where the memristive devices (214) include a first conductive electrode a second conductive electrode and a switching element placed between the conductive electrodes. The first and second conductive electrodes may be formed of an electrically conductive material such as AlCu, AlCuSi, TaAl, TiN, HfN, AlN, Pt, Cu, and WSiN. In some examples the first and second electrode are formed of the same material, and in other examples the second electrode is formed of a different material than the first electrode. In some examples, the first conductive electrode and the second conductive electrode may be referred to as a top electrode and a bottom electrode. In the figures, the top electrode is indicated with a dot.

The switching element may be formed of a switching oxide, such as a metallic oxide. Specific examples of switching oxide materials may include magnesium oxide, titanium oxide, zirconium oxide, hafnium oxide, vanadium oxide, niobium oxide, tantalum oxide, chromium oxide, molybdenum oxide, tungsten oxide, manganese oxide, iron oxide, cobalt oxide, copper oxide, zinc oxide, aluminum oxide, gallium oxide, silicon oxide, germanium oxide, tin dioxide, bismuth oxide, nickel oxide, yttrium oxide, gadolinium oxide, and rhenium oxide, among other oxides. In addition to the binary oxides presented above, the switching oxides may be ternary and complex oxides such as silicon oxynitride. The oxides presented may be formed using any of a number of different processes such as sputtering from an oxide target, reactive sputtering from a metal target, atomic layer deposition (ALD), oxidizing a deposited metal or alloy layer, etc. The memristive device (214) may be fabricated through any other reasonably suitable fabrication process, such as, for example, chemical vapor deposition, sputtering, etching, lithography, or other methods of forming memristive device (214).

The memristive devices (214) may be built at the micro- or nano-scale and used as a component in a wide variety of electronic circuits, such as, bases for memories and logic circuits. As described above, when used as a basis for memories, the memristive device (214) may be used to store a bit of information, 1 or 0. When used as a logic circuit, as described herein, the memristive device (214) may be employed to represent bits in a field programmable gate array, as the basis for a wired-logic programmable logic array, or as a dot product engine. The memristive device (214) disclosed herein may also find use in a wide variety of other applications. While specific reference is made to binary memristive devices (214), the memristive devices (214) may be set to more than two resistance states and thereby capable of storing more than two logic values.

More detail regarding switching the state of a memristive device (214) is now given. The state of the memristive devices (214) may be changed in response to various programming conditions and the memristive device (214) is able to exhibit a memory of past electrical conditions. For instance, the memristive device (214) may be programmed to have one of a plurality of distinct states. Particularly, the resistance level of the switching element may be changed through application of an electrical field, e.g., through application of a current or voltage, in which the current or voltage may cause mobile dopants in the switching element to move and/or change the status of conducting channel(s) in the switching element, which may alter the resulting electrical operation of the memristive device (214). That is, for instance, the distinct resistance levels of the switching element, and thus the state of the memristive device (214), may correspond to different programming current levels or voltage amplitudes applied to the switching element.

By way of example, the switching element may be programmed to have a higher resistance level through application of an earlier current or voltage level. After removal of the current or voltage, the locations and characteristics of the dopants or conducting channels are to remain stable until the application of another programming electrical field. That is, the switching element remains at the programmed resistance level following removal of the current or voltage. While specific reference is made to memristive devices (214), other resistive memory elements may be used also. Other examples of resistive memory elements include resistive random-access memory (RRAM) elements, phase-change random-access memory (PCRAM), and magnetoresistive random-access memory (MRAM).

Each bit cell (212) also includes at least one selecting transistor (216-1, 216-2). The selecting transistors (216) are serially coupled to the corresponding memristive device (214). A selecting transistor (216) is a component that either allows current to flow through the memristive device (214), prevents current from flowing through the memristive device (214), or regulates the current flowing through the memristive device (214). For example, the selecting transistor (216) opens and closes to either form a closed circuit or open circuit in the bit cell (212). The selecting transistor (216) has a threshold voltage, $V_t$. When a voltage applied between the gate and source of a selecting transistor (216) is substantially less than the threshold voltage, the selecting transistor (216) is open such that no current flows to a corresponding memristive device (214). By comparison, when a voltage applied along a column is substantially greater than the threshold voltage, the selecting transistor (216) closes such that current readily flows to a corresponding memristive device (214). At voltages in the vicinity of the threshold voltage, the selecting transistor (216) will saturate and limit the current through the corresponding memristive device (214). In other words, if the selecting transistor (216) is open, no current flows through the bit cell (212) and the memristive device (214) is not selected, regardless of any voltage passed along corresponding row lines. However, if both selecting transistors (216) are closed, or one is closed and another is operated in saturation, and a voltage potential is generated via adjacent row lines, current flows through the bit cell (212). Put yet another way, a selected, or target bit cell (212) is one that sees a voltage potential via the adjacent row lines as well as has activated selecting transistors (216).

A bit cell (212) may include multiple selecting transistors (216). Specifically, a first selecting transistor (216-1) is coupled to the memristive device (214) and having a gate thereon coupled to a row line. Similarly, a second selecting transistor (216-2) is coupled to the memristive device (214) and has a gate thereon coupled to a column line. Each selecting transistor (216) may function as an output leg of the first current mirror of which the input leg (108) transistor is the input depending on the polarity of the operation. For example, a first transistor (216-1) functions as the output leg of the first current mirror during a set or positive polarity read. By comparison, the second transistor (216-2) functions as the output leg of the first current mirror during a reset or negative polarity read.

An example set operation for the memristive device (214) is now described relative to FIG. 2. Note that in a set operation, a memristive device (214) is switched from a high resistance state to a low resistance state. In this operation, an input voltage, $V_{in}$, is applied to the gate of the source follower transistor (104). The output of the source follower transistor, $V_s$, represents a switching voltage that will appear on a top electrode of the memristive device (214), which top electrode 1) is identified with a dot and 2) is serially coupled to the first selecting transistor (216-1). The switching voltage, $V_s$, is the value of $V_{in}$ minus a constant resulting from the characteristics of the source follower transistor (104). To ensure the relationship between $V_{in}$ and $V_s$ is maintained, the control circuit (100) includes a first current control component (103) in the form of a transistor. Specifically, the first current control component (103) is tied to a voltage source that provides a constant voltage value to the gate of the transistor of the first current control component (103). The source that biases the first current control component (103) can be shared by various current control components, such that the source can provide a constant bias to multiple control circuits (100), i.e., multiple row lines and/or column lines.

The switching voltage, $V_s$, is passed to the input leg (108) of the first current mirror, which input leg (108) includes a transistor. As described above, in some examples such as that depicted in FIG. 2, the output leg of the first current mirror is the first selecting transistor (216-1) of the memristive bit cell (212). In other examples, the second selecting transistor (216-2) of the memristive bit cell (212) is the output leg of the first current mirror. As the input leg (108) and the output leg (i.e., the first selecting transistor (216-1)) each have the same gate voltage, if they both have the same current passing through, both will have the same voltage on their source. Accordingly, a second current control component (105) which may include a p-type field effect transistor (PFET) monitors the current through the output leg (i.e., the first selecting transistor (216-1)) and mirrors that current to the third current control component (107) and thereby places the same current through the input leg (108) transistor. Accordingly, as both the input leg (108) and output leg (i.e., selecting transistor (216-1)) now have the same current flowing through, the voltage that is on the source of the input leg (108) transistor is propagated through to the source of the first selecting transistor (216-1) which has the effect of closing the first selecting transistor (216-1) and placing the switching voltage on the top electrode of the memristive device (214). In this example, an instance of the control circuit (100) is coupled to the second selecting transistor (216-2). With the control circuit (100) acting as a driver, the second selecting transistor (216-2) can act as a switch allowing the voltage applied to the bottom electrode to generate a voltage potential across the memristive device (214) when applied in conjunction with the $V_s$ signal applied at the top electrode. In another example, the second selecting transistor (216-2) can act as a current limiter as described below.

While specific reference has been made to a set operation, and a switching voltage, $V_s$, related to setting the memristive device (214). A similar procedure is carried out for a reset operation, however, the switching voltage, $V_s$ being passed to a bottom electrode instead of the top electrode, and the switching voltage value $V_s$, being a reset switching voltage as opposed to a set switching voltage.

As described above, as a memristive device (214) changes states its resistance can change significantly, for example by a factor of 10. As such, the current through the selecting transistors (216) and the second control components (105) can also change by a factor of 10. Accordingly, the absorption component (110), which may include another current mirror, drains the current from the input leg (108) of the first current mirror regardless of the magnitude of the current. For example, the fourth current control component (109) mirrors the current passing through the second current mirror input leg (i.e., second current control component (105)). The current mirror of the absorption component (110) can then match the current passing through the input leg (108) of the first current mirror to maintain a voltage integrity between sources and gates of the input leg (108) of the first current mirror and the output leg (i.e., first selecting transistor (216-1)) of the first current mirror.

As described, the control circuit (100) described herein therefore allows a shaped waveform to be passed to the memristive device (214), which shaped waveform leads to enhanced cell behavior including enhanced endurance, retention, and read and write margins.

Figure 3:
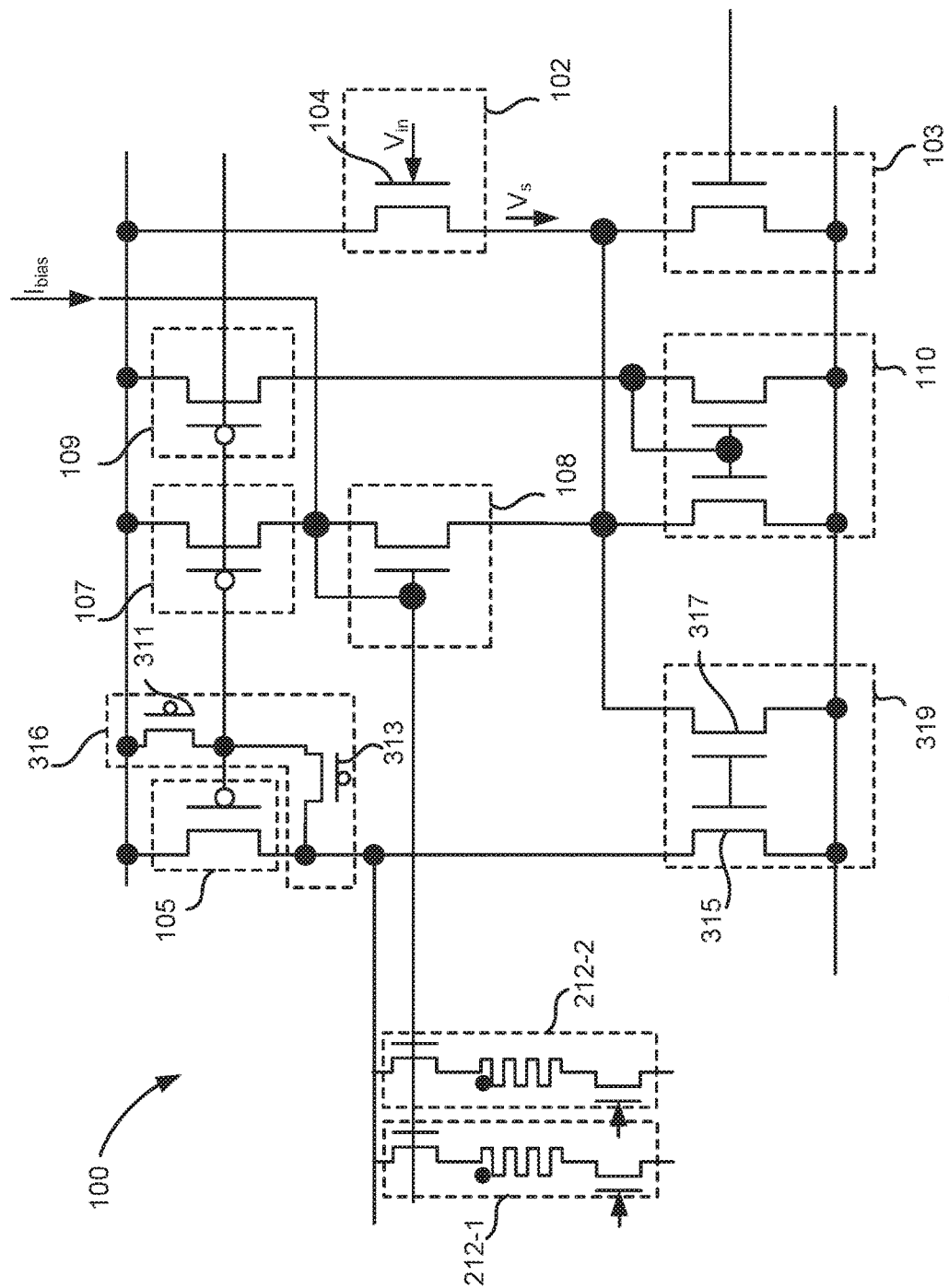
FIG. 3 is a diagram of memristive bit cells and a control circuit for a memristive device, according to another example of the principles described herein.

FIG. 3 is a diagram of a control circuit (100) for a memristive device (FIG. 2, 214), according to another example of the principles described herein. In FIG. 3 a simplified bit cell (212-1, 212-2) is illustrated. As described above, the control circuit (100) may be used as a first interconnect line driver or a second interconnect line driver. In one terminology, the control circuit (100) may be used as a column driver and a row driver. Accordingly, the control circuit (100) in some examples includes a switching component to allow the control circuit (100) to be switched between a row driver and a column driver. The switching component (316) includes a first portion (316) and a second portion (319). When used as a column driver or a row driver, different components of the control circuit (100) may be set to different states.

For example, when setting a particular memristive device (FIG. 2, 214), an instance of the control circuit (100) coupled to a target row line may have certain transistors open while other transistors are closed while an instance of the control circuit (100) coupled to a target column line has a different set of transistors that are open and closed. Still further, when resetting a particular memristive device (FIG. 2, 214), an instance of the control circuit (100) coupled to a target row line may have certain transistors open while other transistors are closed while an instance of the control circuit (100) coupled to a target column line has a different set of transistors that are open and closed. Accordingly, the switching component (316) allows one control circuit (100) layout to be utilized as both a row driver and a column driver during a set operation and similarly one control circuit (100) layout to be utilized as both a column driver and a row driver during a reset operation.

A first portion (316) of the switching component includes at least two switching transistors (311, 313) and a second portion (319) of the switching component (316) includes at least two additional switching transistors (315, 317). The first portion (316) switching transistors (311, 313) operate to enable the gate to drain connection of the transistor in the input leg of the second current control component (105). Doing so allows the second current control component (105) to 1) act as an input of a current mirror or 2) open. For example, when implemented as a row driver in a set operation, it may be desirable for the second current control component (105) to act as an input to a current mirror with the third current control component (107) and the fourth current control component (109) to ensure constant current through corresponding transistors as described above. In this configuration, the second switching transistor (313) of the first portion (316-1) is on while the first switching transistor (311) of the first portion (316-1) is off. In this example, the control circuit (100) is providing the positive rail and control signals to the bit cells (212-1, 212-2).

In other examples, such as when an instance of the control circuit (100) is being used as a column driver in a set operation and the control circuit (100) is required to provide the negative rail and control signal to the bit cells (212-1, 212-2), it is desirable for the second, third, and fourth current control component (105, 107, 109) to be turned off. This is done by pulling all the gates of the corresponding transistors of the second, third, and fourth current control components (105, 107, 109) to $V_{dd}$. In this configuration, the first switching transistor (311) of the first portion (316) is turned on and the second switching transistor (313) of the first portion (316) is turned off.

The second portion (319) allows the control circuit (100) to provide the negative rail to the bit cells (212-1, 212-2) when required. In other words, when a column driver, the first transistor (315) of the second portion (319) allows the negative rail, i.e., $V_{ss}$, to be applied to the bit cell (212) and the second transistor (317) of the second portion (316-2) applies $V_{ss}$ to the source of the FET of the input leg (108) of the first current mirror. An $I_{bias}$ signal then can either 1) provide a current to the input leg (108) of the first current mirror, which is mirrored in the FET in the bit cell and serves to limit the current through the bit cell (212) to no more than $I_{bias}$, or, 2) pull the drain of the input leg (108) of the first current mirror high, which fully turns on the FET (FIG. 2, 216-2) in the bit cell (212). When acting as a row driver, both the transistors (315, 317) in the second portion (319) are turned off and $I_{bias}$ floats. More detail regarding the activity of various components of the switching component (316) is provided below in connection with FIGS. 4 and 5.

Figure 4:
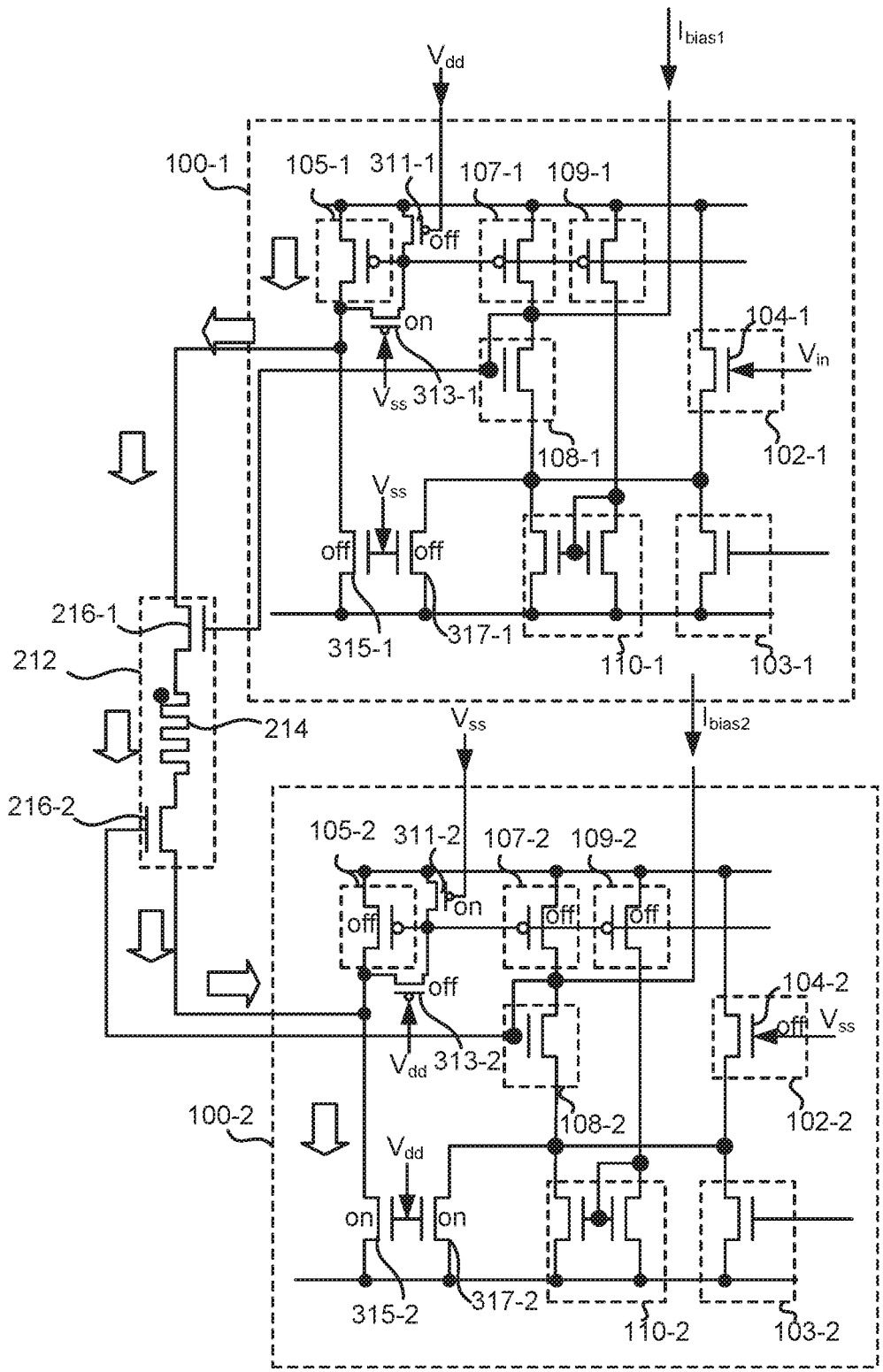
FIG. 4 is a diagram of control circuits of a selected cell as used to set a memristive device, according to another example of the principles described herein.

FIG. 4 is a diagram of a first and second control circuit (100-1, 100-2) of a selected cell (212) as used to set a memristive device (214), according to another example of the principles described herein. It should be noted that in FIG. 4-6 elements denoted as "-1" refer to instances of components found in a first control circuit (100-1) and elements denoted as "-2" refer to instances of components found in a second control circuit (100-2), except as applied to components in the memristive bit cell (212). For example, the first and second selecting transistors (216-1, 216-2) do not pertain to the control circuits (100-1, 100-2) but to the memristive bit cell (FIG. 2, 212).

As described above, instances of the control circuit (100-1, 100-2) may be used as column drivers and row drivers. Accordingly, the first control circuit (100-1) is a row driver and the second control circuit (100-2) is a column driver. FIG. 4 depicts how various components in the different control circuits (100-1, 100-2) are configured during a set operation.

To select a particular bit cell (212) a voltage potential is generated across the bit cell (212). In a set operation this may be accomplished by setting a positive voltage, $V_{dd}$, to the top of the memristive device (214) and applying a negative, or ground voltage, $V_{ss}$, to the bottom of the memristive device (214). In the first, or row, control circuit (100-1), the first selecting transistor (311-1) of the first portion (FIG. 3, 316) is turned off, and the second selecting transistor (313-1) of the second portion (FIG. 3, 316) is turned on. Doing so allows the transistor of the second current control component (105-1) to act as a current mirror as described above to pass the switching voltage, $V_s$, to the memristive device (214) as described above. This, at least in part, ensures that the current in the first current mirror (i.e., the input leg (108-1) transistor and the first selecting transistor (216-1)) are the same so as to ensure that the switching voltage $V_s$ is in fact passed to the memristive device (214). In this example, the $I_{bias1}$ signal of the first control circuit (100-1) is floated so as to not interfere with the operation of the input leg (108-1) of the first current mirror.

Still further, the transistors (315-1, 317-1) of the second portion (FIG. 3, 319) in the first, or row, control circuit (100-1) are both turned off. By comparison, during the set operation, the second column control circuit (100-2) has the first selecting transistor (311-2) of the first portion (FIG. 3, 316) turned on and the second selecting transistor (313-2) of the first portion (FIG. 3, 316) turned off to ensure that the second, third, and fourth current control component (105-2, 107-2, 109-2) of the second, or column, control circuit (100-2) are turned off. This is done by pulling their corresponding gates to $V_{dd}$. The second, or column, control circuit (100-2) also has the transistors (315-2, 317-2) of the second portion (FIG. 3, 319) turned on. In this example, the first transistor (315-2) of the second portion (FIG. 3, 319) provides the negative rail to the bit cell (212) and the second transistor (317-2) of the second portion (FIG. 3, 319) turning the input leg (108-2) into the input of a current mirror (which is paired with the second selecting transistor (216-2) of the bit cell (212)).

With the source of the input leg (108-2) at ground, and $V_{in}$ also at ground (i.e., turning off the source follower component (104-2) of the column control circuit (100-2)), $I_{bias2}$ can be either 1) tied to $V_{dd}$ to turn on the second selecting transistor (216-2) or 2) the input of a current that is equal to the current limit that will be enforced by second selecting transistor (216-2). The gate to the first current control component (103-2) of the second control circuit (100-2) may be left active since the second transistor (317-2) of the second portion (FIG. 3, 319) ties its drain to $V_{ss}$ (i.e., the first current control component (103-2) source and drain are both at the same potential, $V_{ss}$) and the source follower component (104-2) is not conducting.

Figure 5:
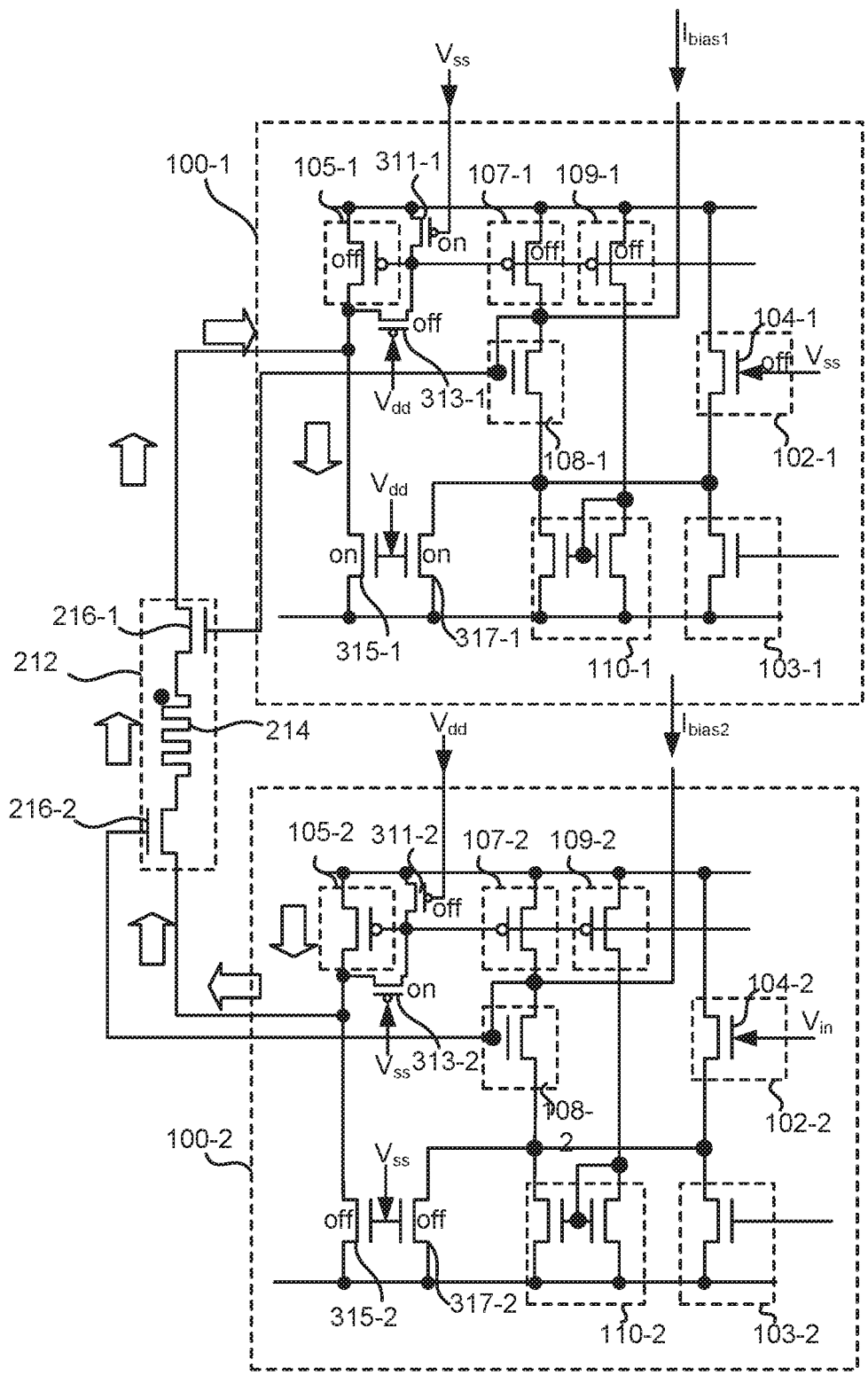
FIG. 5 is a diagram of control circuits of a selected cell as used to reset a memristive device, according to another example of the principles described herein.

FIG. 5 is a diagram of control circuits (100-1, 100-2) of a selected cell (212) as used to reset a memristive device (214), according to another example of the principles described herein. As described above, instances of the control circuit (100-1, 100-2) may be used as column drivers and row drivers. Accordingly, the first control circuit (100-1) is a row driver and the second control circuit (100-2) is a column driver. FIG. 5 depicts how various components in the different control circuits (100-1, 100-2) are configured during a reset operation.

To select a particular bit cell (212) a voltage potential is generated across the bit cell (212). In a reset operation this may be accomplished by setting a positive voltage, $V_{dd}$, to the bottom of the memristive device (214) and applying a negative, or ground voltage, $V_{ss}$, to the top of the memristive device (214). In the second, or column, control circuit (100-2), the first selecting transistor (311-2) of the first portion (FIG. 3, 316) is turned off, and the second selecting transistor (313-2) of the first portion (FIG. 3, 316) is turned on. Doing so allows the transistor of the second current control component (105-2) of the second control circuit (100-2) to act as a current mirror as described above to pass the reset switching voltage, $V_s$, to the memristive device (214) as described above. This, at least in part, ensures that the current in the first current mirror (i.e., the input leg (108-2) transistor and the second selecting transistor (216-2)) are the same so as to ensure that the reset switching voltage, $V_s$, is in fact passed to the memristive device (214). In this example, the $I_{bias2}$ signal of the second control circuit (100-2) is floated so as to not interfere with the operation of the input leg (108-2) of the first current mirror.

Still further, the transistors (315-2, 317-2) of the second portion (FIG. 3, 319) in the second, or column, control circuit (100-2) are both turned off. By comparison, during the reset operation, the first, or row, control circuit (100-1) has the first selecting transistor (311-1) of the first portion (FIG. 3, 316) turned on and the second selecting transistor (313-1) of the first portion (FIG. 3, 316) turned off to ensure that the second, third, and fourth current control component (105-1, 107-1, 109-1) of the row control circuit (100-1) are turned off. This is done by pulling their corresponding gates to $V_{dd}$. The row control circuit (100-1) also has the transistors (315-1, 317-1) of the second portion (FIG. 3, 319) turned on. In this example, the first transistor (315-1) of the second portion (FIG. 3, 319) provides the negative rail to the bit cell (212) and the second transistor (317-1) of the second portion (FIG. 3, 319) turning the input leg (108-1) into the input of a current mirror (which is paired with the second selecting transistor (216-1) of the bit cell (212)).

With the source of the input leg (108-1) at ground, and $V_{in}$ also at ground (i.e., turning off the source follower component (104-1) of the row control circuit (100-2)), $I_{bias1}$ can be either 1) tied to $V_{dd}$ to turn on the first selecting transistor (216-1) or 2) the input of a current that is equal to the current limit that will be enforced by first selecting transistor (216-1). The gate to the first current control component (103-1) of the first control circuit (100-1) may be left active since the second transistor (317-1) of the second portion (FIG. 3, 319) ties its drain to $V_{ss}$ (i.e., the first current control component (103-1) source and drain are both at the same potential, $V_{ss}$) and the source follower component (104-1) is not conducting.

Still in regards to FIG. 5, the first selecting transistor (216-1) can act as a switch or as a current limiting device depending on the disposition of the $I_{bias1}$ signal. As a current limiting device, the first selecting transistor (216-1) is an output of a current mirror formed with the input leg (108-1) and $I_{bias1}$ sets the current limit. To operate as a switch, the gate of the first selecting transistor (216-1) is pulled high by tying $I_{bias1}$ high.

Figure 6:
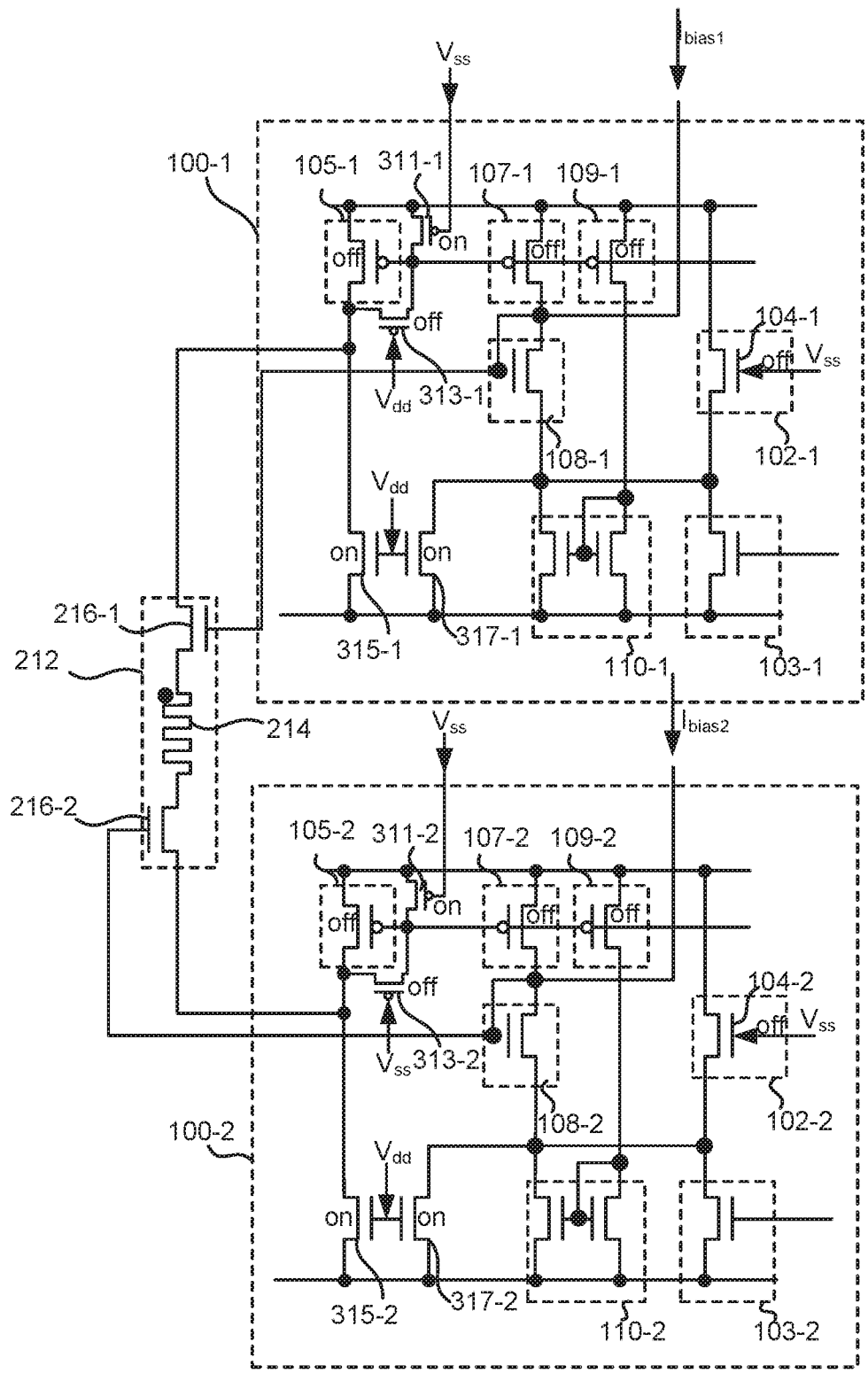
FIG. 6 is a diagram of control circuits of an unselected selected cell, according to another example of the principles described herein.

FIG. 6 is a diagram of control circuits (100-1, 100-2) of an unselected cell (212) as used to reset a memristive device (214), according to another example of the principles described herein. For an unselected cell both instances of the first selecting transistor (311) of the first portion (FIG. 3, 316) are turned on and the second selecting transistor (313) of the first portion (FIG. 3, 316) turned off to ensure that the second, third, and fourth current control component (105, 107, 109) of the control circuits (100) are turned off. This is done by pulling their corresponding gates to $V_{dd}$. The transistors (315, 317) of the second portion (FIG. 3, 319) are also turned on. Also in the unselected cell (212), the input $V_{in}$ is tied to $V_{ss}$ and $I_{bias1}$ and $I_{bias2}$ float.

Figure 7:
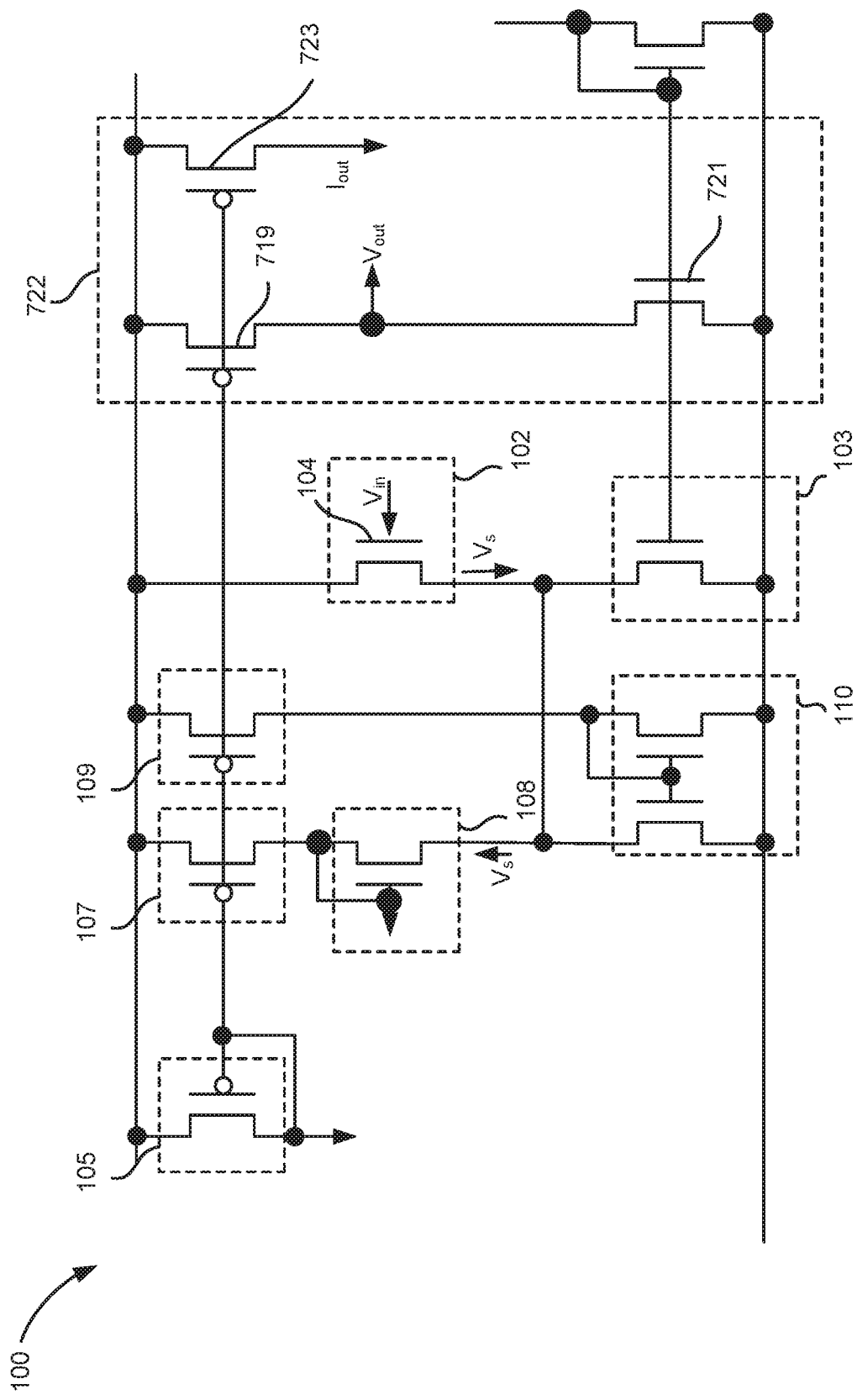
FIG. 7 is a diagram of a control circuit for a memristive device, according to another example of the principles described herein.

FIG. 7 is a diagram of a control circuit (100) for a memristive device (FIG. 2, 214), according to another example of the principles described herein. As described above, the control circuit (100) includes a source following component (102) to receive an input voltage, $V_{in}$, and output a switching voltage, $V_s$, which switching voltage may be a reset switching voltage or a set switching voltage. The control circuit (100) also includes an input leg (108) of a first current mirror, which input leg (108) is coupled to the source following component (102). The input leg (108) of the first current mirror replicates the switching voltage, $V_s$, to an output leg of a current mirror, which output leg is found in the memristive bit cell (FIG. 2, 212). The control circuit (100) also includes a number of current control components (103, 105, 107, 109) to 1) enforce a constant current through the source following component (102) and 2) maintain the input leg (108) of the current mirror and the output leg of the current mirror at the same current.

The control circuit (100) further includes a sensing component (722) to output a signal indicative of the state of the memristive device (FIG. 2, 214). The sensing component (722) allows many different uses of the control circuit (100). For example, via the sensing component (722), the output signal, can be passed to other circuitry as either a digital output value or an analog output value. To this end, the sensing component (722) converts the output into both a digital output value and an analog output value.

For example, a first transistor (719) of the sensing component (722) acts as an output leg of a current mirror formed with a transistor of the second current control component (105). This first transistor (719) of the sensing component (722) along with a second transistor (721) of the sensing component (722) convert an output current value indicating the resistive state of the memristive device (214) into a voltage. In this example, the second transistor (721) of the sensing component (722) acts like a constant current sink.

Depending on the relative current of the first and second transistors (719, 721) of the sensing component (722), a digital voltage output will be a certain value. For example, if the first transistor (719) of the sensing component (722) is sourcing more than the second transistor (721) of the sensing component (722) is draining, this will pull the output upwards above a threshold amount. By comparison, if the second transistor (721) of the sensing component (722) is draining more than the first transistor (719) of the sensing component (722) is sourcing this will pull the output voltage below a threshold amount. The value of the output voltage can then be used to determine the state of the memristive device (FIG. 2, 214) depending on whether the output voltage is above or below this predetermined threshold. The predetermined threshold may be selected based on the characteristics of the system. Still further, the constant current sunk by the second transistor (721) of the sensing component (722) may be such that $V_{out}$ will be lower than the threshold when in one state and above the threshold when in another state.

In regards to an analog output, i.e., a current output, a third transistor (723) of the sensing component (722) is also an output leg of a current mirror to the input leg of the second current control component (105). Accordingly, an analog output is generated via the third transistor (723) of the sensing component (722). As has been demonstrated the sensing component (722) outputs both an analog output and a digital output allowing both an analog read process and a digital read process.

The sensing component (722) can be tied to other components. For example, the control circuit (100) may be an upstream component for a circuit that would enforce write termination. In a write termination circuit, an output value, either analog or digital is used to indicate that the memristive device (FIG. 2, 214) has switched. Once this signal indicating a switch has occurred has been received, the circuitry that performs the write, stops the stimulus to the memristive device (FIG. 2, 214) for example, by stopping application of a voltage or current to the memristive device (FIG. 2, 214). As the control circuit (100) monitors the state of the memristive device (FIG. 2, 214), and the switching thereof, the control circuit (FIG. 1, 100) can also be used in measuring the switching time. The measurement of which can lead to quicker, enhanced, and more efficient writing of memristive devices (FIG. 2, 214).

Figure 8:
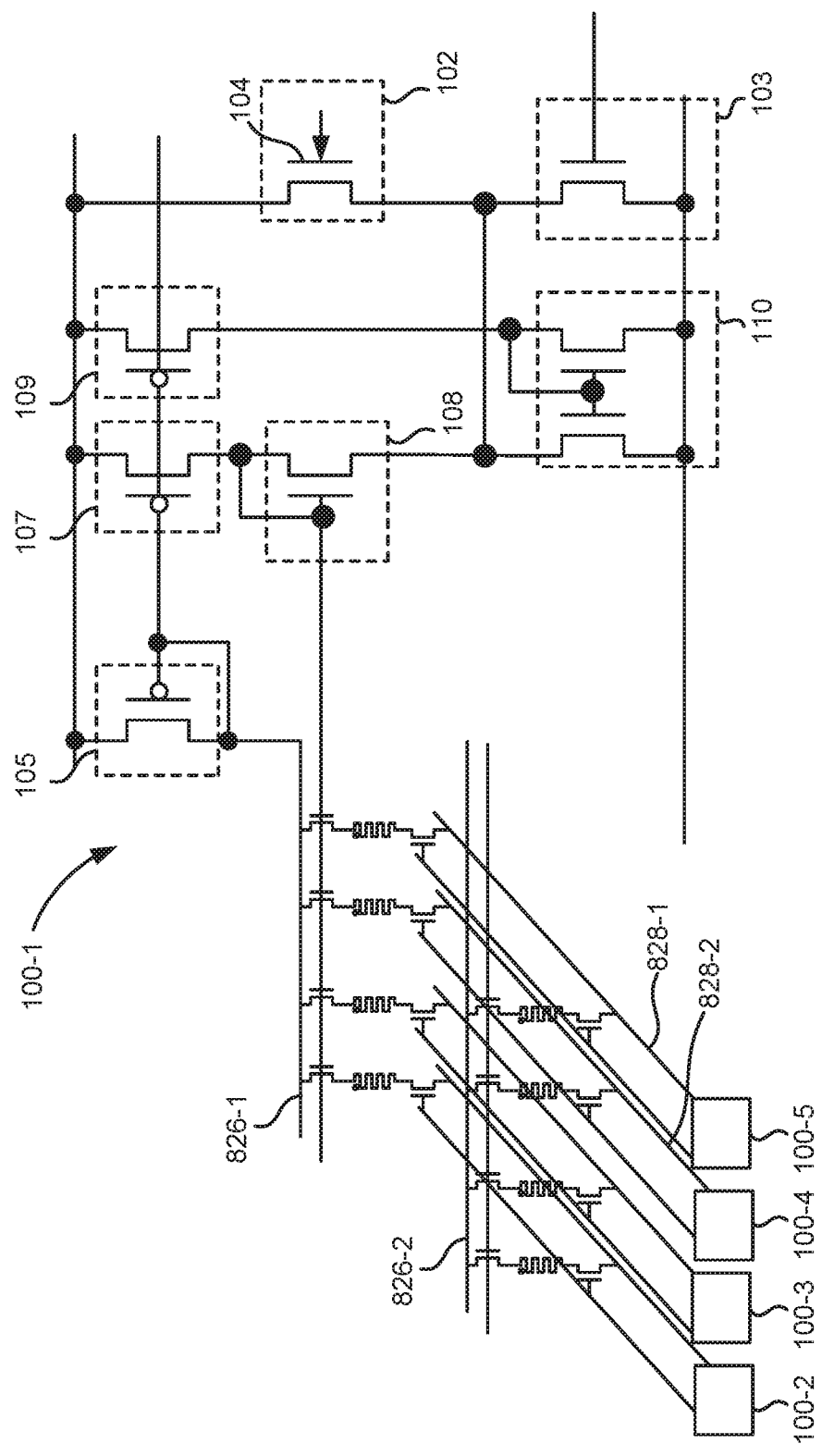
FIG. 8 is a diagram of a control circuit fora memristive device and a memristive array, according to another example of the principles described herein.

FIG. 8 is a diagram of a control circuit (100) for memristive devices (FIG. 2, 214) in a memristive array, according to another example of the principles described herein. The memristive array includes a first number of generally parallel interconnect lines (826-1, 826-2) running in a first direction and a second group of generally parallel interconnect lines (828-1, 828-2) running in a second direction. For example the first number of lines (826-1, 826-2) may be orthogonal to the second lines (828-1, 828-2). Such an array is referred to as a crossbar array. In one example, one group of lines is referred to as row lines and the second group of lines is referred to as column lines. The intersection of the first lines and the second lines results in a junction. A memristive bit cell (FIG. 2, 212) is coupled between the row lines and the column lines at the junctions. Each memristive bit cell (FIG. 2, 212) can be uniquely addressed by selecting the corresponding row line and column line for a memristive bit cell (FIG. 2, 212).

The array also includes a number of first line control circuits (100-1). The array also includes a number of second line, or column control circuits (100-2, 100-3, 100-4, 100-5). For simplicity, in FIG. 8, just one first line control circuit (100-1) is indicated in detail. However, each row of memristive bit cells (FIG. 2, 212) would have similar first line control circuits (100-1) and second line control circuits (100-2, 100-3, 100-4, 100-5). For example, each instance of a row driver and a column driver includes an instance of a control circuit which control circuit includes a source following component (102), an input leg (108) to a first current mirror and a number of current control components (103, 105, 107, 109). Further, each control circuit may include a sensing component as described above.

When functioning as an array, one of the control circuits (100) is used to pass a signal, such as a waveform to a gate of a selecting transistor (FIG. 2, 216) while the other control circuit (100) is just providing a gate voltage. Accordingly, multiple rows may be activated and a single column activated. In this fashion multiple memristive cells (FIG. 2, 212) may be read to or written from simultaneously. In other words, as all memristive devices (FIG. 2, 214) along a column have their second selecting transistor (FIG. 2, 216) activated, other rows (i.e., rows that are unselected) do not respond. Accordingly, as the column driver signals are voltages, multiple rows can be simultaneously selected for reading or writing. In the case where the array is tied to other circuitry such as a write termination signal for a row, each output of a switching component can independently generate its own write-termination signal for that row.

Figure 9:
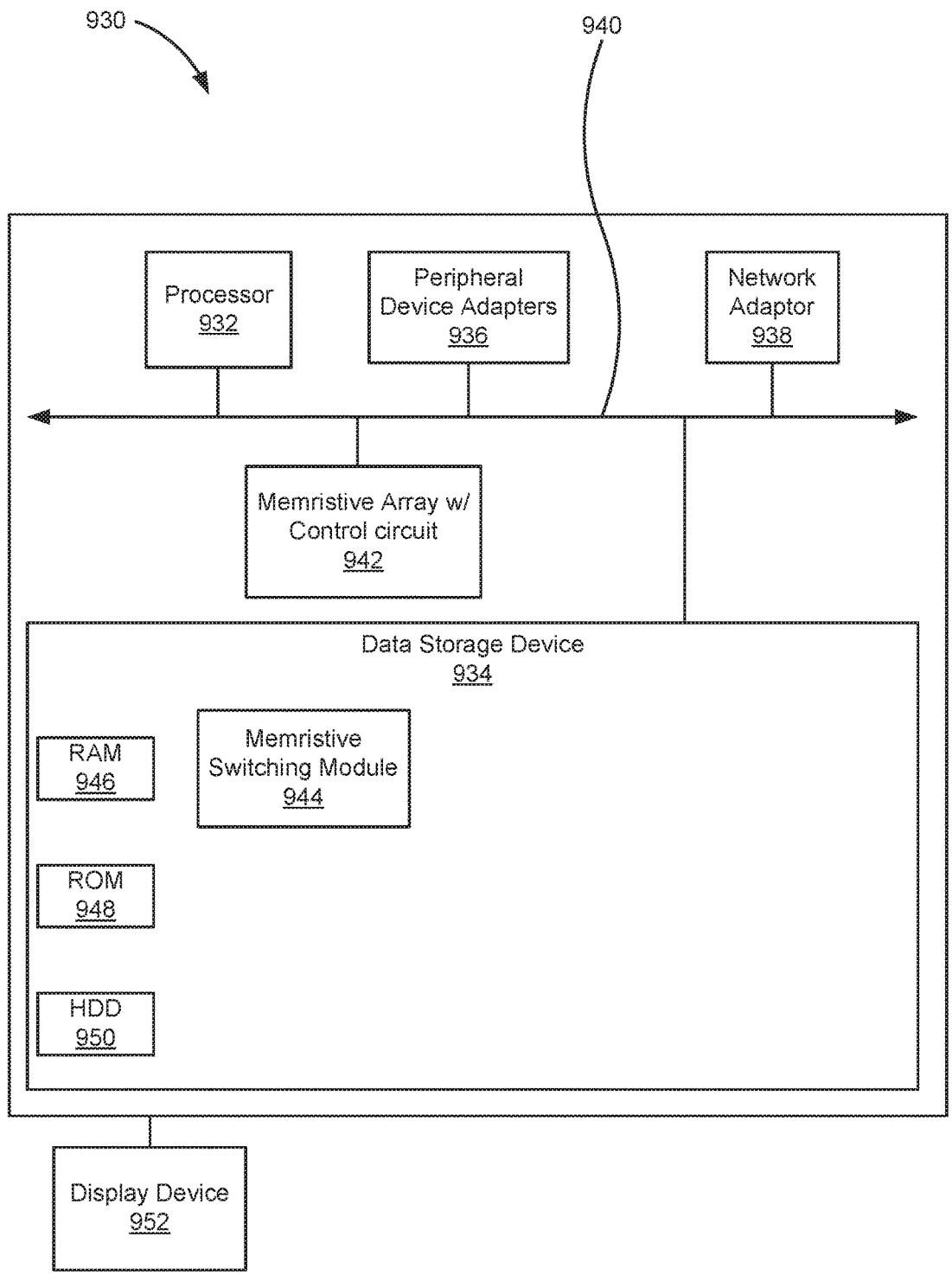
FIG. 9 is a diagram of a computing system that uses a memristive control circuit with current control components, according to one example of the principles described herein.

FIG. 9 is a diagram of a computing system (930) that uses a memristive control circuit (FIG. 1, 100) with current control components, according to one example of the principles described herein. The computing system (930) may be implemented in an electronic device. Examples of electronic devices include servers, desktop computers, laptop computers, personal digital assistants (PDAs), mobile devices, smartphones, gaming systems, and tablets, among other electronic devices.

The computing system (930) may be utilized in any data processing scenario including, stand-alone hardware, mobile applications, through a computing network, or combinations thereof. Further, the computing system (930) may be used in a computing network, a public cloud network, a private cloud network, a hybrid cloud network, other forms of networks, or combinations thereof. In one example, the methods provided by the computing system (930) are provided as a service over a network by, for example, a third party.

To achieve its desired functionality, the computing system (930) includes various hardware components. Among these hardware components may be a number of processors (932), a number of data storage devices (934), a number of peripheral device adapters (936), and a number of network adapters (938). These hardware components may be interconnected through the use of a number of busses and/or network connections. In one example, the processor (932), data storage device (934), peripheral device adapters (936), and a network adapter (938) may be communicatively coupled via a bus (940).

The processor (932) may include the hardware architecture to retrieve executable code from the data storage device (934) and execute the executable code. The executable code may, when executed by the processor (932), cause the processor (932) to implement at least the functionality of controlling the switching of a memristive element of a memristive array. The functionality of the computing system (930) is in accordance to the methods of the present specification described herein. In the course of executing code, the processor (932) may receive input from and provide output to a number of the remaining hardware units.

The data storage device (934) may store data such as executable program code that is executed by the processor (932) or other processing device. As will be discussed, the data storage device (934) may specifically store computer code representing a number of applications that the processor (932) executes to implement at least the functionality described herein.

The data storage device (934) may include various types of memory modules, including volatile and nonvolatile memory. For example, the data storage device (934) of the present example includes Random Access Memory (RAM) (946), Read Only Memory (ROM) (948), and Hard Disk Drive (HDD) memory (950). Many other types of memory may also be utilized, and the present specification contemplates the use of many varying type(s) of memory in the data storage device (934) as may suit a particular application of the principles described herein. In certain examples, different types of memory in the data storage device (934) may be used for different data storage needs. For example, in certain examples the processor (932) may boot from Read Only Memory (ROM) (948), maintain nonvolatile storage in the Hard Disk Drive (HDD) memory (950), and execute program code stored in Random Access Memory (RAM) (946).

The data storage device (934) may include a computer readable medium, a computer readable storage medium, or a non-transitory computer readable medium, among others. For example, the data storage device (934) may be, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (936, 938) in the computing system (930) enable the processor (932) to interface with various other hardware elements, external and internal to the computing system (930). For example, the peripheral device adapters (936) may provide an interface to input/output devices, such as, for example, display device (952), a mouse, or a keyboard. The peripheral device adapters (936) may also provide access to other external devices such as an external storage device, a number of network devices such as, for example, servers, switches, and routers, client devices, other types of computing devices, and combinations thereof.

The display device (952) may be provided to allow a user of the computing system (930) to interact with and implement the functionality of the computing system (930). The peripheral device adapters (936) may also create an interface between the processor (932) and the display device (952), a printer, or other media output devices. The network adapter (938) may provide an interface to other computing devices within, for example, a network, thereby enabling the transmission of data between the computing system (930) and other devices located within the network.

The computing system (930) may, when executed by the processor (932), display the number of graphical user interfaces (GUIs) on the display device (952) associated with the executable program code representing the number of applications stored on the data storage device (934). The GUIs may display, for example, interactive screenshots that allow a user to interact with the computing system (930) to input values in association with the memristive array (942) as will be described in more detail below. Additionally, via making a number of interactive gestures on the GUIs of the display device (952), a user may obtain a dot product value based on the input data. Examples of display devices (952) include a computer screen, a laptop screen, a mobile device screen, a personal digital assistant (PDA) screen, and a tablet screen, among other display devices (952).

The computing system (930) may further include a memristive array (942) that uses a control circuit (FIG. 1, 100). The array (942) includes a number of bit cells (FIG. 2, 212) that include memristive elements (FIG. 2, 214) and selecting transistors (FIG. 2, 216). Such bit cells (FIG. 2, 212) are arranged in an array such as a cross-bar array. The array (942) also includes a control circuit (FIG. 1, 100) to pass shaped waveforms to the memristive devices (FIG. 2, 214) among other operations.

The computing system (930) further includes a number of modules used in the implementation of the systems and methods described herein. The various modules within the computing system (930) include executable program code that may be executed separately. In this example, the various modules may be stored as separate computer program products. In another example, the various modules within the computing system (930) may be combined within a number of computer program products; each computer program product including a number of the modules.

The computing system (930) may include a memristive switching module (944) to, when executed by the processor (932), assist in the functionality of the memristive array (942). The memristive switching module (944), for example, is used to determine the voltages applied to the row lines and column lines of the array. The memristive switching module (944) also assists in selecting particular memristive elements to target. While specific reference is made to a few particular operations, the memristive switching module (944) carries out a number of different operations in conjunction with the switching of memristive elements in the memristive array.

Using a control circuit that performs the various functions described herein 1) allows a single control circuit to be used in multiple applications thereby reducing overhead in manufacturing control circuits; 2) allows for a single control circuit design to be used as a first line control circuit or a second line control circuit; and 3) passes a non-square waveform switching pulse to the memristive bit cell to at least increase retention, endurance, and read-write margins. However, it is contemplated that the devices disclosed herein may provide useful in addressing other matters and deficiencies in a number of technical areas. Therefore the systems and methods disclosed herein should not be construed as addressing any of the particular matters.

The preceding description has been presented to illustrate and describe examples of the principles described. This description is not intended to be exhaustive or to limit these principles to any precise form disclosed. Many modifications and variations are possible in light of the above teaching.

What is claimed is:

1. A control circuit for a memristive device comprising:
a source following component to receive an input voltage and output a switching voltage;
an input leg of a current mirror coupled to the source following component, the input leg of the current mirror to replicate the switching voltage to an output leg of the current mirror of a memristive bit cell; and
a number of current control components to:
    enforce a constant current through the source following component; and
    maintain the input leg of the current mirror and the output leg of the current mirror at the same current.

2. The control circuit of claim 1, wherein the source following component is a transistor to receive the input voltage at a gate of the transistor.

3. The control circuit of claim 1, wherein the input voltage is a non-square voltage pulse.

4. The control circuit of claim 1, wherein the input voltage is a square voltage pulse.

5. The control circuit of claim 1, wherein the current control components comprise:
a first current control component comprising a transistor to enforce the constant current through the source following component; and
a number of additional current control components comprising transistors to maintain a similar current across the input leg of the current mirror and the output leg of the current mirror.

6. The control circuit of claim 1, further comprising an absorption component to absorb current as a memristive device switches between states.

7. The control circuit of claim 1, wherein the control circuit is used as a row driver and a column driver in a memristive array.

8. The control circuit of claim 1, further comprising a switching component to allow the control circuit to switch between driving a row of memristive devices and driving a column of memristive devices.

9. A memristive array comprising:
a number of first lines;
a number of second lines intersecting the first lines to form a number of junctions;
a number of memristive bit cells coupled between the first lines and the second lines at the junctions;
a number of first line drivers coupled to the number of first lines; and
a number of second line drivers coupled to the number of second lines;
wherein:
    each of the number of first line drivers and each of the number of second line drivers comprise an instance of a control circuit; and
    a control circuit comprises:
        a source following component to receive an input voltage and output a switching voltage;
        an input leg of a current mirror coupled to the source following component, the input leg to replicate the switching voltage to an output leg of the current mirror of a memristive bit cell; and
        a number of current control components to:
            enforce a constant current through the source following component; and
            maintain the input leg and the output leg at the same current.

10. The array of claim 9, wherein a bit cell comprises:
a memristive element;
a first selecting transistor coupled to the memristive element, the first selecting transistor having a gate and at least one of a drain and a source therein coupled to a first line driver; and
a second selecting transistor coupled to the memristive element, the second selecting transistor having a gate and at least one of a drain and a source therein coupled to a second line driver.

11. The array of claim 10, wherein the first selecting transistor and the second selecting transistor comprise output legs of current mirrors that are coupled to input legs of the current mirrors of corresponding instances of a control circuit.

12. The array of claim 9, wherein multiple first lines of the array or multiple second lines of the array are simultaneously activated.

13. The array of claim 9, wherein the control circuit further comprises a selecting component to activate corresponding interconnect lines for a bit cell.

14. A control circuit for a memristive device comprising:
a source following component to receive an input voltage and output a switching voltage;
an input leg of a current mirror coupled to the source following component, the input leg to replicate the switching voltage to an output leg of the current mirror of a memristive bit cell;
a number of current control components to:
    enforce a constant current through the source following component; and
    maintain the input leg and the output leg at the same current; and
a sensing component to output a value of the memristive element, wherein the output defines a logic value.

15. The control circuit of claim 13, wherein the sensing component converts the output to a digital output value and an analog output value.

* * * * *